（12）United States Patent
Jones (10) Patent No.: US 9,159,698 B2
(45) Date of Patent: Oct. 13, 2015

(54) METHOD FOR PRODUCING A SEMICONDUCTOR MODULE ARRANGEMENT

(71) Applicant: Infineon Technologies AG, Neubiberg (DE)

(72) Inventor: Patrick Jones, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/161,022

(22) Filed: Jan. 22, 2014

(65) Prior Publication Data

US 2014/0206151 A1    Jul. 24, 2014

(30) Foreign Application Priority Data

Jan. 24, 2013    (DE) .................... 10 2013 100 700

(51) Int. Cl.
| | |
|---|---|
| H01L 21/06 | (2006.01) |
| H01L 23/00 | (2006.01) |
| H05K 3/36 | (2006.01) |
| H01L 25/16 | (2006.01) |
| H01L 25/00 | (2006.01) |
| H01L 23/373 | (2006.01) |
| H05K 1/14 | (2006.01) |

(52) U.S. Cl.
CPC .............. *H01L 24/83* (2013.01); *H01L 25/165* (2013.01); *H01L 25/50* (2013.01); *H05K 3/368* (2013.01); *H01L 23/3735* (2013.01); *H01L 2924/0002* (2013.01); *H01L 2924/1301* (2013.01); *H01L 2924/13055* (2013.01); *H01L 2924/13062* (2013.01); *H01L 2924/13091* (2013.01); *H05K 1/144* (2013.01); *H05K 2201/042* (2013.01); *H05K 2201/1031* (2013.01); *H05K 2201/10303* (2013.01); *H05K 2201/10424* (2013.01)

(58) Field of Classification Search
USPC ........ 324/750.16, 750.19; 438/123, 124, 103, 438/110; 257/678
See application file for complete search history.

(56) References Cited

U.S. PATENT DOCUMENTS

| | | | |
|---|---|---|---|
| 5,956,835 A | 9/1999 | Aksu | |
| 8,044,673 B1 * | 10/2011 | Burgyan | .................. 324/750.16 |
| 8,558,554 B2 * | 10/2013 | Erdman et al. | ................. 324/537 |
| 8,587,331 B2 * | 11/2013 | Berry et al. | .............. 324/750.16 |
| 8,723,538 B2 * | 5/2014 | Hung et al. | .............. 324/750.16 |
| 8,760,182 B2 * | 6/2014 | Wood et al. | .............. 324/750.16 |
| 2014/0062516 A1 * | 3/2014 | Rashidzadeh et al. | ... 324/750.19 |

FOREIGN PATENT DOCUMENTS

| | | |
|---|---|---|
| DE | 10348979 A1 | 2/2005 |
| DE | 102009015312 A1 | 10/2009 |
| DE | 102010063387 A1 | 6/2012 |

* cited by examiner

*Primary Examiner* — Errol Fernandes
(74) *Attorney, Agent, or Firm* — Murphy, Bilak & Homiller, PLLC (57) ABSTRACT

A method for producing a semiconductor module arrangement includes providing a semiconductor module and a printed circuit board. The semiconductor module has a circuit mount populated with a semiconductor chip, an adjustment device in a first relative position with respect to the circuit mount, and a plurality of electrical connections each of which has a free end. Each of the connections is routed through a different passage opening in the adjustment device. The printed circuit board is pushed onto the electrical connections by each of the free ends being inserted into a different contact opening in the printed circuit board. The adjustment device is moved to a second relative position, which is different from the first relative position, with respect to the circuit mount.

12 Claims, 11 Drawing Sheets

METHOD FOR PRODUCING A SEMICONDUCTOR MODULE ARRANGEMENT

PRIORITY CLAIM

This application claims priority to German Patent Application No. 10 2013 100 700.7, filed on 24 Jan. 2013, the content of said German application incorporated herein by reference in its entirety.

TECHNICAL FIELD

The invention relates to a method for producing a semiconductor module arrangement.

BACKGROUND

A printed circuit board often has to make electrical contact with semiconductor modules. To this end, the semiconductor module has a number of electrical connections which have to be positioned very precisely relative to the printed circuit board. If, for example, each of the electrical connections is intended to be pressed into a different contact opening in the printed circuit board, there is a risk of one or more of the electrical connections not meeting the associated contact openings to a sufficiently accurate degree and a pressing-in operation not being possible. Therefore, the printed circuit board is generally fitted manually, so that individual electrical connections can be readjusted as required. However, processing of this kind is very complicated and therefore costly.

DE 10 2010 063 387 A1 discloses a circuit arrangement having two sub-modules, in which circuit arrangement electrical contacts of a contact lug are oriented in an accurate manner in respect of position and centered by means of an auxiliary support.

SUMMARY

The embodiments described herein provide a method for producing a semiconductor module arrangement, the method allowing precise positioning of electrical connections relative to pre-specified contact regions, such as contact openings in the printed circuit board for example.

According to an embodiment of the method, the method comprises: providing a semiconductor module comprising a circuit mount populated with a semiconductor chip, an adjustment device in a first relative position with respect to the circuit mount and fitted to the circuit mount, a plurality of electrical connections each having a free end, wherein each of the electrical connections is routed through a different passage opening in the adjustment device; pushing a printed circuit board onto the electrical connections by each of the free ends being inserted into a different contact opening in the printed circuit board; and moving the adjustment device to a second relative position, which is different from the first relative position, with respect to the circuit mount.

Those skilled in the art will recognize additional features and advantages upon reading the following detailed description, and upon viewing the accompanying drawings.

BRIEF DESCRIPTION OF THE DRAWINGS

The invention will be explained below using exemplary embodiments with reference to the appended figures. The illustration in the figures is not to scale. In the figures, identical reference symbols indicate identical elements with the same function. Unless stated otherwise, the elements, features, methods and method steps shown in the various figures can be combined with one another in any desired manner provided that they are not mutually exclusive.

FIG. 1G shows the arrangement according to FIG. 1F after the printed circuit board is pushed onto the electrical connections of the base module, wherein the adjustment device has been moved from the first relative position to a second relative position with respect to the circuit mount by the printed circuit board being pushed on.

DETAILED DESCRIPTION

Figure 1A:
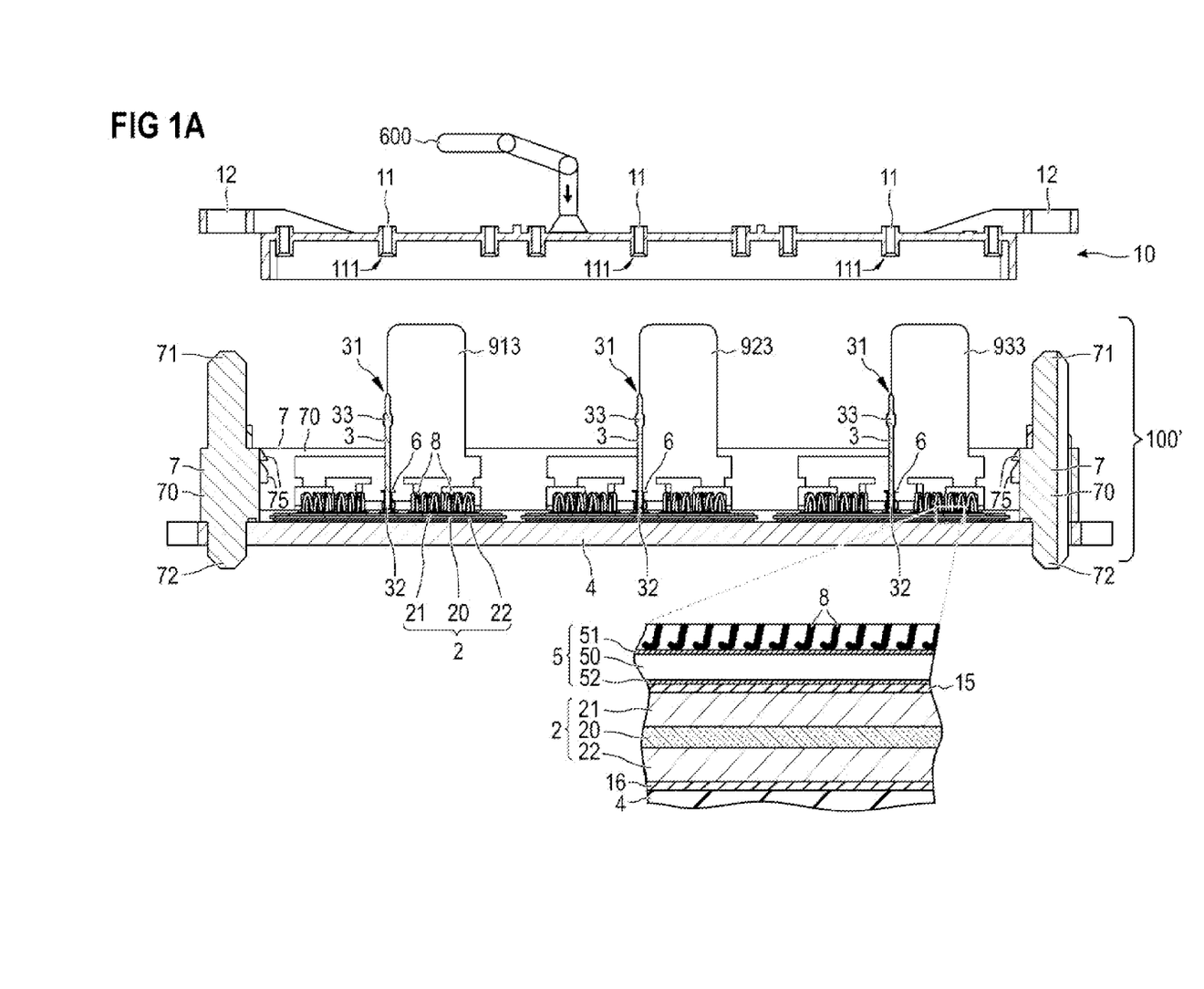
FIG. 1A shows a cross section through components of a semiconductor module during fitting of an adjustment device to a pre-populated, partially fabricated base module.
Figure 1B:
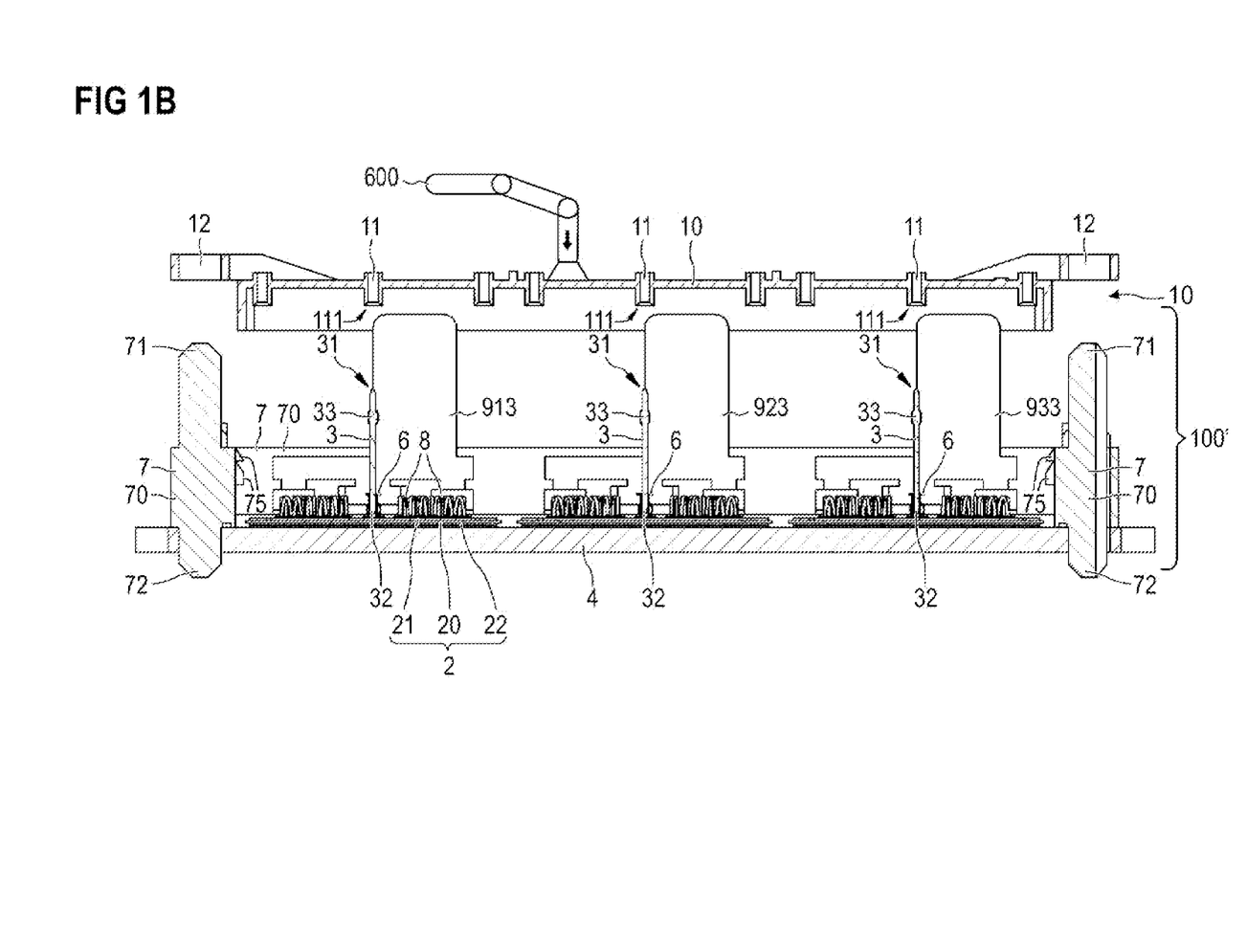
FIG. 1B shows the arrangement according to FIG. 1A when the adjustment device is pushed onto electrical connections of the base module.

FIG. 1A shows a base semiconductor module 100' with, by way of example, three circuit mounts 2 which are at a distance from one another. It is also possible for only precisely one, precisely two or else more than three circuit mounts 2 to be provided instead of three circuit mounts 2. A section of the base semiconductor module 100' from the region of one of the circuit mounts is illustrated on an enlarged scale. However, the construction in the region of the other circuit mounts 2 is similar. At least one semiconductor chip 5 is arranged on each of the circuit mounts 2.

The semiconductor chip 5 has a semiconductor body 50 which is provided with an upper contact metallization 51 and a lower contact metallization 52. A semiconductor chip 5 of this kind can be, for example, a controllable semiconductor switch, for example a MOSFET, an IGBT, a JFET, a thyristor or any desired other controllable semiconductor switch, or a non-controllable semiconductor switch, such as a diode for example. The upper and lower contact metallizations 51 and, respectively, 52 can form, for example, source and drain, drain and source, emitter and collector, collector and emitter, anode and cathode or cathode and anode. If a semiconductor chip 5 is a controllable semiconductor switch, it has a control connection, that is to say a gate connection or a base connection, which is formed by a further metallization (not illustrated) which can be located on the top face of the semiconductor body 50 next to the upper contact metallization 51 and electrically insulated from said upper contact metallization, or can be located on the bottom face of the semiconductor body 50 next to the lower contact metallization 52 and electrically insulated from said lower contact metallization.

The base semiconductor module 100' can have, for example, precisely one or else several individual semiconductor switches. It is likewise possible, for example, for two individual switches to be connected in series so as to form a half-bridge. In this case, one semiconductor module 100 can contain, for example, precisely one, precisely two, precisely three or else more than three half-bridges of this kind. In principle however, a circuit mount 2 can be populated in any desired manner.

Each of the circuit mounts 2 has a dielectric insulation carrier 20 which is provided with an upper metallization layer 21 on its top face. The upper metallization layer 21 can be patterned or unpatterned. The insulation carrier 20 can optionally be provided with a lower metallization layer 22 on its bottom face which is averted from the upper metallization layer 21. In this case, the upper metallization layer 21 and the lower metallization layer 22 can be electrically insulated from one another.

The upper metallization layer 21 and/or—if provided—the lower metallization layer 22 can be composed, for example, of copper, a copper alloy, aluminum, an aluminum alloy, but also any other metal. The insulation carrier 20 can be in the form of, for example, ceramic and be composed of, for example, aluminum oxide, aluminum nitride or silicon nitride. The circuit mount 2 may be, for example, a DCB (direct copper bonding) substrate, a DAB (direct aluminum bonding) substrate or an AMB (active metal brazing) substrate. However, it is likewise possible to use a conventional printed circuit board (PCB) as the circuit mount 2.

A further, optional constituent part of the base semiconductor module 100' is a solid, for example metal, base plate 4. Said base plate serves as a support for the populated circuit mount 2. During operation of the finished semiconductor module, the lost heat which is produced, in particular, in the semiconductor chips 5 is dissipated to a heat sink (not illustrated here) which is attached to that face of the base plate 4 which is averted from the circuit mount 2 or from the circuit mounts 2. If a solid base plate 4 is not used in a semiconductor module, the heat sink is attached to the lower metallization layer 22 or to the lower metallization layers 22 of the circuit mount 2 or of the circuit mounts 2.

As can be seen from the section which is illustrated on an enlarged scale, the semiconductor chips 5 are connected to the circuit mount 2, on which they are respectively arranged, with the aid of a connecting layer 15. In this case, the connecting layer 15 makes direct contact both with the lower contact metallization 52 of the semiconductor chip 5 and also with the upper metallization layer 21 of the circuit mount 2 in question.

If a base plate 4 is provided, each of the circuit mounts 2 is cohesively connected to the base plate 4 with the aid of a connecting layer 16. In this case, the connecting layer 16 makes direct contact both with the lower metallization layer 22 of the circuit mount 2 in question and also with the base plate 4.

The connecting layers 15, 16 can be in the form of solder layers or in the form of sintered connecting layers, independently of one another and in any desired combinations with one another. In the case of a sintered connecting layer, said sintered connecting layer can contain, for example, a sintered silver powder.

The semiconductor module also has a housing 7 which can provide electrical insulation. The housing 7 can be composed, for example, of thermosetting or of thermoplastic material. A housing 7 of this kind can be produced, for example, by means of an injection-molding technique. The housing 7 can optionally have an annular side wall 70 which surrounds, in particular, the circuit mount or circuit mounts 2 and also the semiconductor chip or semiconductor chips 5 which are arranged on said circuit mount or circuit mounts.

Electrical connection contacts 3, 913, 923, 933 are provided in order to electrically connect the finished semiconductor module to external components. A load current flows through each of the semiconductor chips 5 during operation of the finished semiconductor module. For this purpose, a "load current" is understood to be a current through a semiconductor chip 5 which current flows through the semiconductor body 50 between source and drain, between emitter and collector or between anode and cathode, that is to say between the upper contact metallization 51 and the lower contact metallization 52. Since load currents of this kind can assume very high values in semiconductor modules, it is necessary for the associated electrical connection contacts to have a high current-carrying capacity. This is achieved by a large conductor cross section of the connection contacts. In the exemplary embodiment shown, the connection contacts 913, 923, 933, which are in the form of stamped and bent metal sheets, constitute some of the load connection contacts. The connection contacts 913, 923, 933 are electrically conductively connected, for example by means of a soldered connecting layer or a sintered connecting layer as explained above, to an upper metallization layer 21 of a circuit mount 2 or to the upper contact metallization 51 of a semiconductor chip 5.

In addition to connection contacts 913, 923, 933 through which a load current flows through one or more semiconductor chips 5, one or more connection contacts 3 are also present, said connection contacts serving to transmit small signals, as are required, for example, to actuate control connections of a semiconductor chip 5 or to transmit further signals which transmit information about the state of the semiconductor module, such as the temperature of a semiconductor chip 5 for example.

These connection contacts 3 are in the form of substantially straight pins which have a free first end 31 and also a second end 32 which is opposite the first end 31. The second ends 32 are each inserted into an electrically conductive, for example metal, sleeve 6 and in this way electrically conductively connected to said sleeve. The sleeves 6, for their part, are electrically conductively connected, for example by soldering, to the upper metallization layer 21 of one of the circuit mounts 2. An electrically conductive connection between a connection pin 3 and a conductor track which is formed in the upper metallization layer 21 can be realized in this way. Over its further course, a conductor track of this kind can be connected to any desired electrical potentials of the circuit which is realized on the circuit mount 2. Bonding wires 8 can likewise optionally be used for this purpose, as for producing any other desired electrical connections.

As an alternative to inserting pins 3 of this kind into sleeves 6 which are soldered to the metallization layer 21, the pins can also be fitted on and electrically conductively connected to the metallization layer 21 in any other desired way. The connection techniques used for this purpose can, in principle, be selected as desired. Merely by way of example, laser welding, friction welding, ultrasonic welding or arc welding may be cited for this purpose.

As explained, the connection contacts 3 are suitable primarily for transmitting small electrical signals. However, it is likewise possible to connect two or more connection contacts 3 of this kind electrically in parallel and as a result to increase the current-carrying capacity, so that the parallel circuit comprising the two or more connection contacts 3 can also be used as a load connection for transmitting a load current which flows through one or more semiconductor chips 5.

The connection contacts 3 can optionally each have a press-in region 33 which is pressed into a contact hole in a printed circuit board and in the process is plastically deformed, so that an electrical press-in connection is established between the connection contact 3 and the printed circuit board. A press-in connection of this kind can be formed or established, in particular, in accordance with DIN EN 60352-5, as at April 2004.

Pressing the press-in regions 33 into corresponding contact holes in a printed circuit board requires the first free ends 31 of the connection contacts 3 to engage into respective contact openings in the printed circuit board when said printed circuit board is mounted onto the base semiconductor module 100'. On account of the elongate design of the connection contacts 3 and also on account of a very wide variety of component and manufacturing tolerances when producing the base semiconductor module 100', there is a high probability, in the case of at least one of the connection contacts 3, of which the free first end 31 is not in the desired position which is required, of the first end 31, when the printed circuit board is mounted onto the base semiconductor module 100', corresponding to the position of the associated contact hole of the printed circuit board to such an extent that it slides into the contact hole during mounting.

In order to avoid this, an adjustment device 10 is provided, said adjustment device having one passage opening 11 for each of the connection contacts 3 and, before a printed circuit board is fitted, being positioned in a first relative position relative to at least one of the circuit mounts 2, so that the connection contacts 3 engage into the passage openings 11 and as a result are oriented to a sufficient extent such that, when a printed circuit board is subsequently mounted, they are always in positions in which the first ends 31 slide into the associated contact openings when a printed circuit board is mounted.

To this end, it is necessary for the adjustment device 10 to be in a defined first relative position with respect to at least one of the circuit mounts 2. To this end, the adjustment device 10 is initially pushed onto the connection contacts 3 in such a way that the free first ends 31 of the connection contacts 3 each engage into the associated passage opening 11 and as a result are in a defined position. In order to ensure that the same problem as was explained above for the mounting of a printed circuit board does not occur here, the passage openings 11 can have a larger minimum diameter than the associated contact openings in the printed circuit board.

As an alternative or in addition, the adjustment device 10 can have an insertion funnel 111 on that face of the passage openings 11 which faces the connection contacts 3, the input opening (that is to say the width of the opening of the insertion funnel 111 at that end from which the connection contacts 3 are pushed into the insertion funnel 111, that is to say on the bottom face in this case) of said insertion funnel is larger than an input opening of the passage openings 11 (that is to say the width of the opening of the passage opening 11 at that end from which the connection contacts 3 are pushed into the passage opening 11, that is to say on the bottom face in this case). Insertion funnels 111 of this kind ensure that the free first ends 31 are received and routed in the direction of the passage openings 11 when the adjustment device 10 is mounted onto the base semiconductor module 100'.

Since the passage openings 11 have a larger minimum diameter than the associated contact openings in the printed circuit board and/or by virtue of the use of insertion funnels 111, the adjustment device 10 can also be fitted on the base semiconductor module 100' by machine, for example by means of a pick-and-place apparatus 600 which is illustrated merely by way of example here.

Figure 1C:
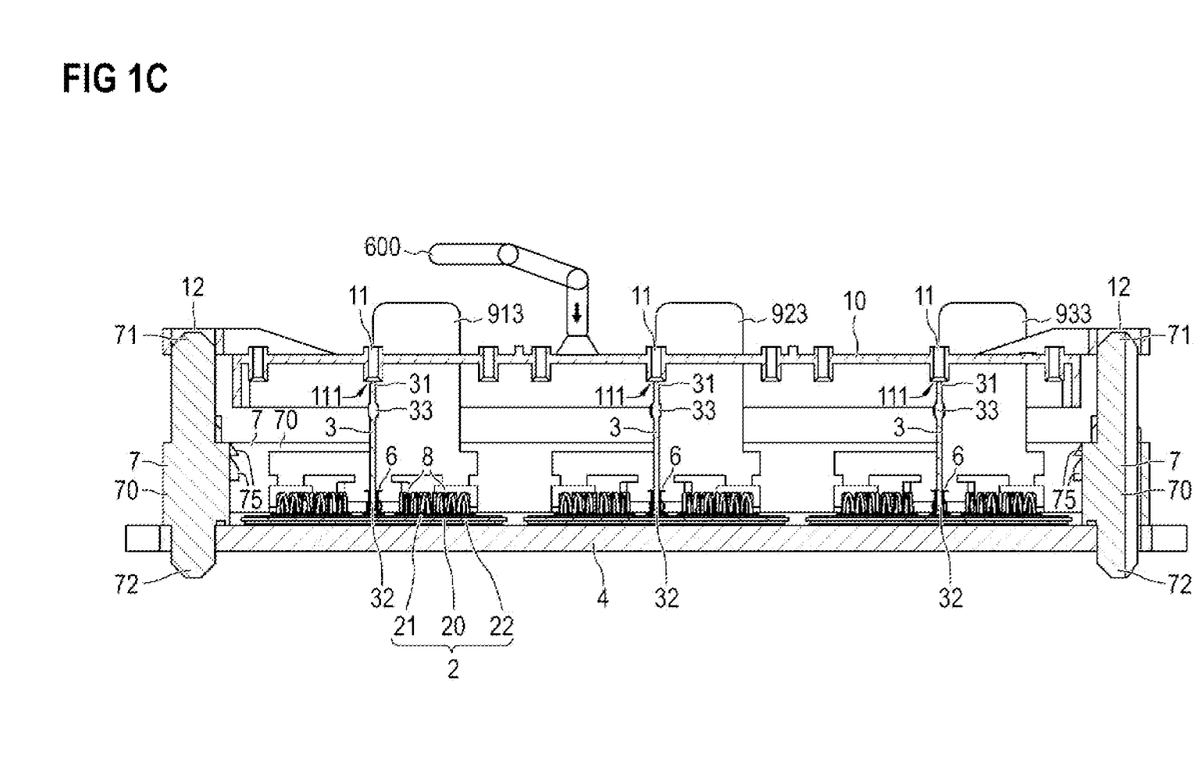
FIG. 1C shows the arrangement according to FIGS. 1A and 1B when the adjustment device is pushed further onto electrical connections of the base module.
Figure 1D:
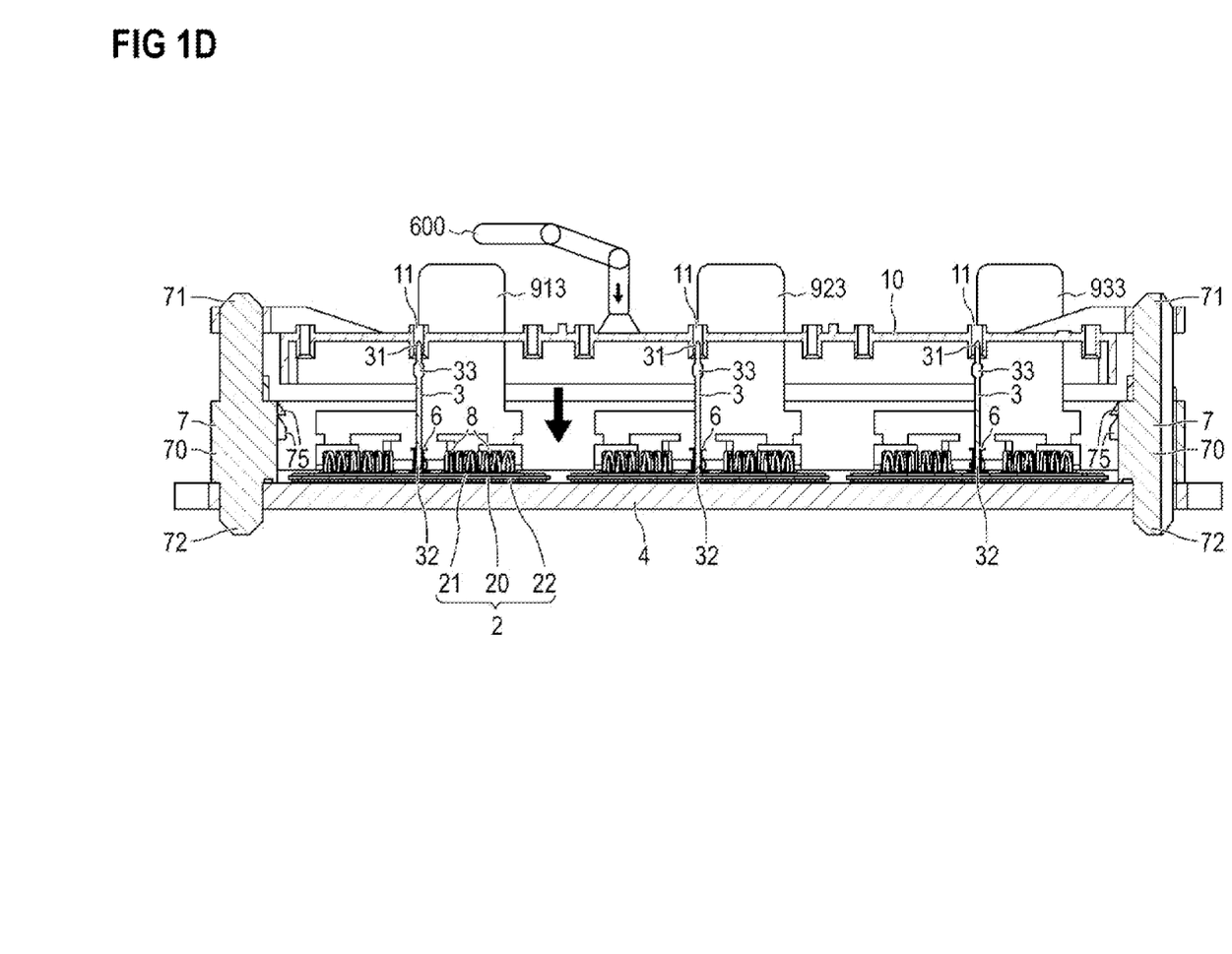
FIG. 1D shows the arrangement according to FIGS. 1A, 1B and 1C when the adjustment device is pushed yet further onto electrical connections of the base module.
Figure 1E:
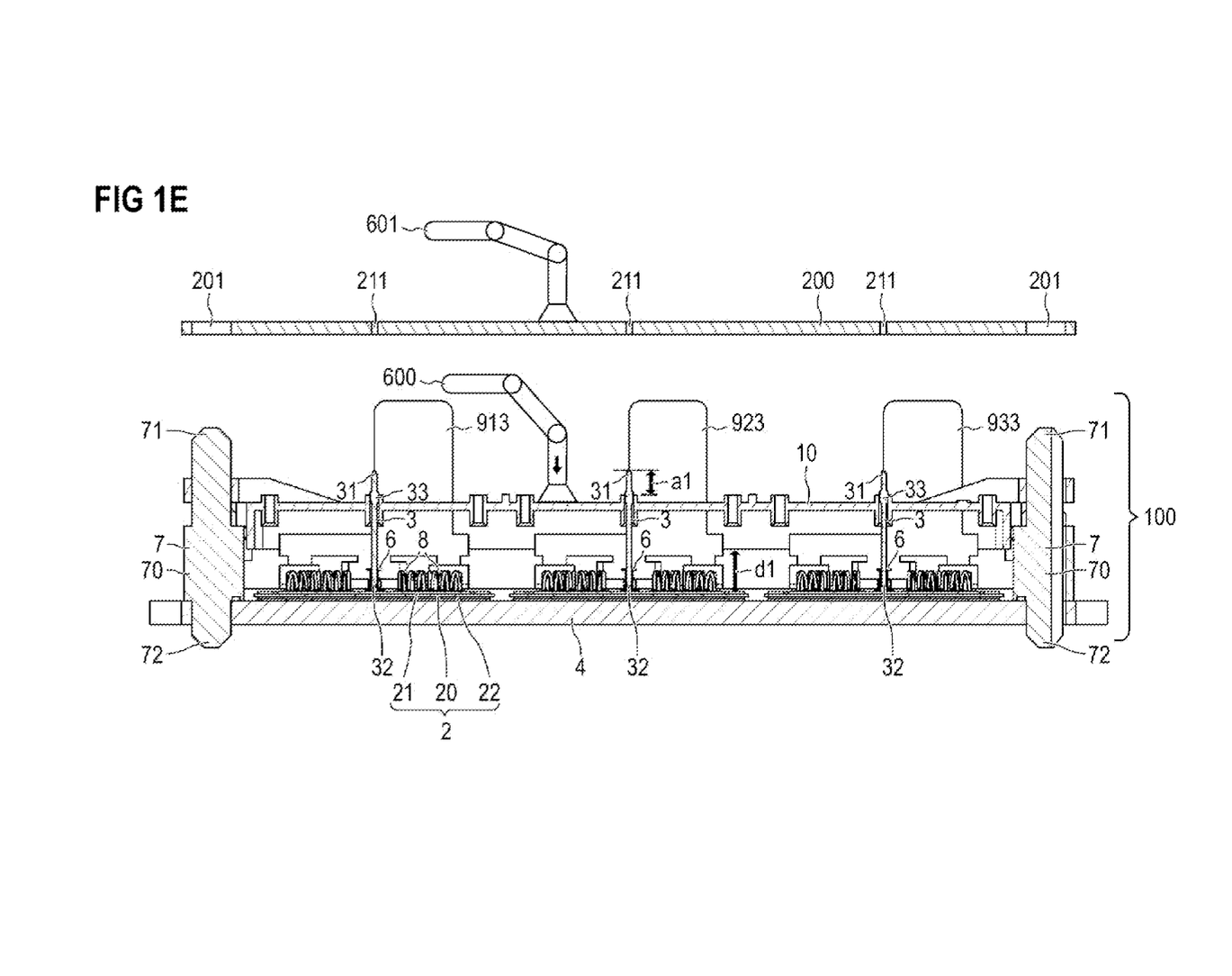
FIG. 1E shows the arrangement according to FIGS. 1A, 1B, 1C and 1D, in which arrangement the adjustment device is in a first relative position with respect to a circuit mount of the base module, and also shows a provided printed circuit board.

FIGS. 1B to 1E show, in chronological order, various points in time during fitting of the adjustment device 10 to the base semiconductor module 100'. FIG. 1C shows a point in time at which the free first ends 31 engage into the optional insertion funnels 111. In FIG. 1E, the adjustment device 10 is finally in its first relative position with respect to the circuit mount 2. There are a very wide variety of options for ensuring that the adjustment device 10 initially remains in this first relative position. One option for this purpose is a latching device 75 which is shown in FIGS. 1A to 1D and can be formed on the housing 7. The latching device 75 can be realized, for example, with the aid of latching lugs of a very wide variety of designs. As an alternative or in addition, however, it is also possible for the adjustment device 10 to be held in the first relative position in relation to the housing 7 by a frictional connection.

As is further shown in FIG. 1E, a printed circuit board 200 which is provided with electrical contact openings 211 is provided. The contact openings 211 can, for example, be in the form of metallized passage openings which are electrically connected to conductor tracks (not illustrated here) of the printed circuit board 200. Conductor tracks of this kind can be located, for example, on the top face and/or on the bottom face but, in addition or as an alternative, also in the interior of the printed circuit board 200.

Since the positions of the first ends 31 of the connection contacts 3 are precisely secured to a sufficient extent by the adjustment device 10, the printed circuit board 200 can now be mounted onto the semiconductor module 100. On account of the pre-positioning by means of the adjustment device 10 which is in the first relative position, the printed circuit board 200 can also be mounted by machine, for example by means of a pick-and-place apparatus 601 which is only schematically illustrated here. The pick-and-place apparatus 601 can optionally be the same pick-and-place apparatus 600 which was also used for mounting the adjustment device 10.

Figure 1F:
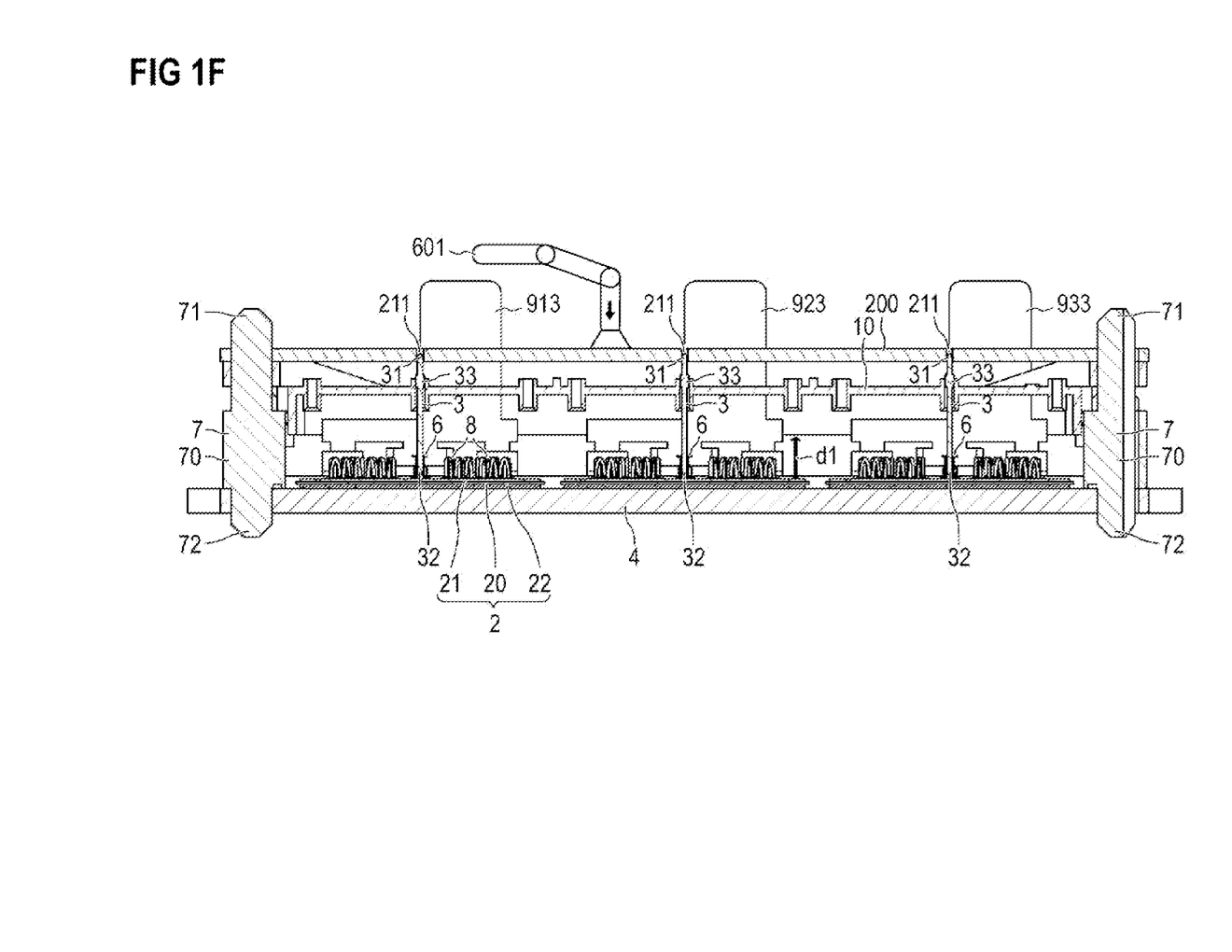
FIG. 1F shows the arrangement according to FIG. 1E when the printed circuit board is pushed onto the electrical connections of the base module, while the adjustment device is in the first relative position.

FIG. 1F shows the arrangement during mounting of the printed circuit board 200 at a point in time at which the free first ends 31 of the connection contacts 3 are each located in one of the contact openings 211 in the printed circuit board 200. The printed circuit board is now pushed further onto the connection contacts 3, until the press-in regions 33 of the connection contacts 3 are located in the contact openings 211 and form press-in connections with said contact openings which can be formed, for example, in accordance with DIN EN 60352-5, as of April 2004. Since the contact openings 211 have a smaller size than the press-in regions 33, the press-in regions 33 are plastically deformed by the press-in operation.

Figure 1G:
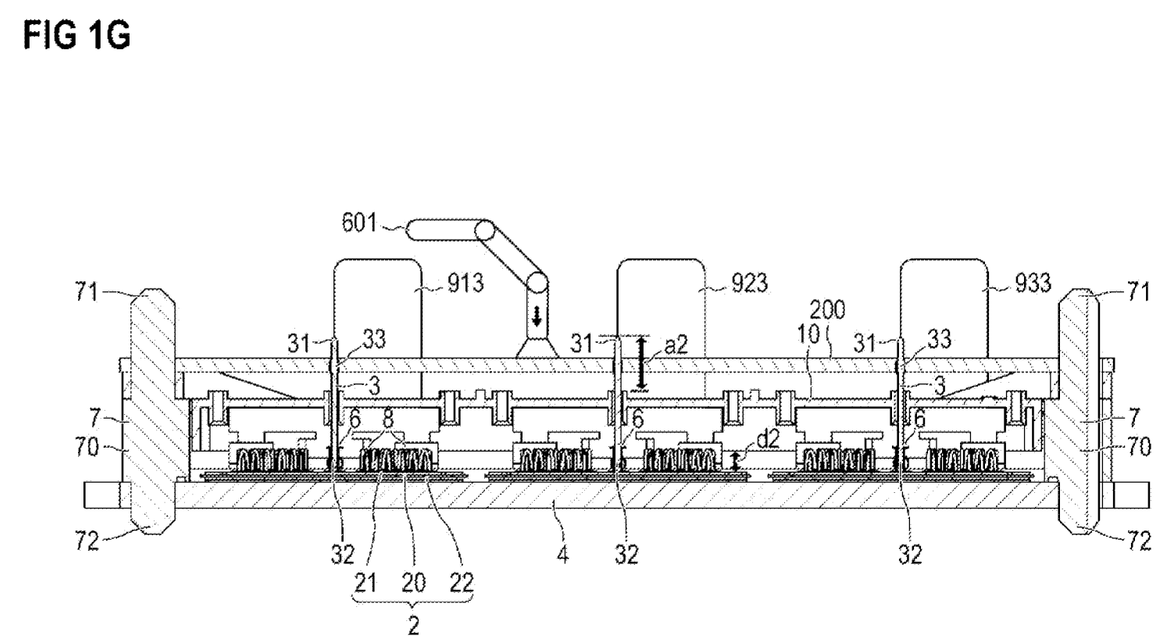

The adjustment device 10 was moved out of its first relative position in the direction of the substrate 2 or of the substrates 2 by the printed circuit board 200 being pushed onto the connection contacts 3, so that said adjustment device is now in a second relative position with respect to at least one of the circuit mounts 2, said second relative position differing from the first relative position. To this end, it is necessary for the holding force with which the adjustment device 10 was held in the first relative position to be overcome by the action of the printed circuit board 200 on the adjustment device 10.

In order to allow the printed circuit board 200 to be mounted onto the semiconductor module 100 in an accurate manner, the semiconductor module 100 can have, for example on the housing 7, one or more adjustment pins 71 which engage into corresponding adjustment openings 201 in the printed circuit board 200 when the printed circuit board 200 is mounted, this being illustrated in particular upon comparing FIGS. 1E and 1F.

As likewise shown by FIGS. 1E to 1G, the housing 7 can have one or more adjustment pins 72 which engage into corresponding adjustment openings in the base plate 4, this being advantageous when the housing 7 is fitted to the base plate 4. The same or different adjustment pins 72 can be used in order to position the semiconductor module 100 on a heat sink 300 by said adjustment pins 72 engaging into positioning openings 301 in the heat sink 300, the result of this being shown in FIG. 1H.

It is clear from the above explanations that, in the second relative position, the adjustment device 10 is at a distance d2 from one of the circuit mounts 2 which distance is smaller than the distance d1 between said circuit mount 2 and the adjustment device 10 when said adjustment device is in the first relative position. The distance d2 can be, for example, at least 1.5 mm, for example approximately 2 mm, smaller than the distance d1. As an alternative or in addition, the difference d1−d2 between the distance d1 and the distance d2 can be, for example, in the range of from 1.5 mm to 3 mm.

As shown in FIG. 1E, the first ends 31 of each of the electrical connections 3 can project out of the adjustment device 10 by a distance a1 of at most 3 mm when the adjustment device 10 is in the first relative position. The distance a1 can be in the range of from 1.5 mm to 3 mm for example.

As further shown in FIG. 1G, the first ends 31 of each of the electrical connections 3 can project out of the adjustment device 10 by a distance a2 of at least 4 mm when the adjustment device 10 is in the second relative position.

Figure 1H:
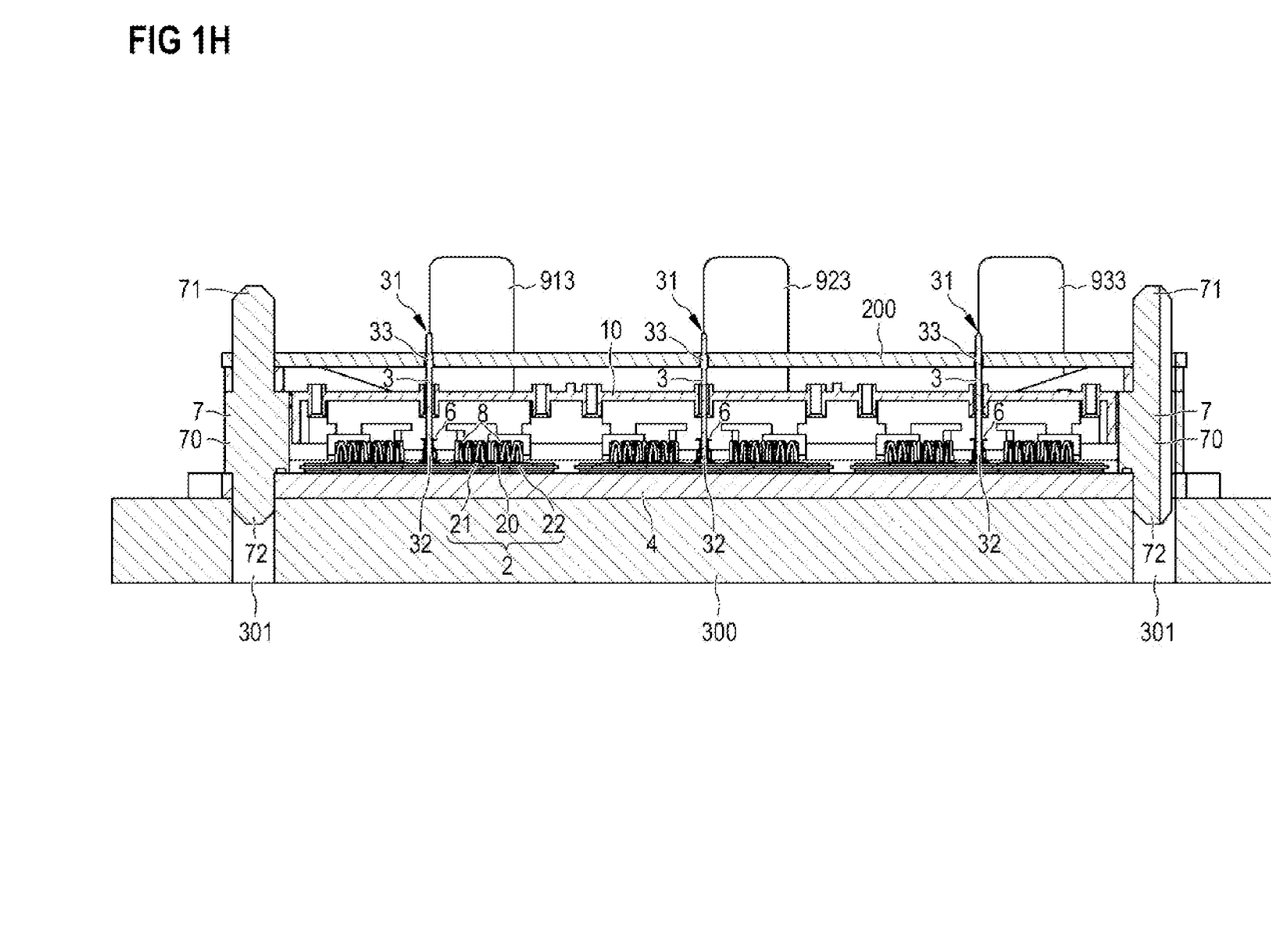
FIG. 1H shows the arrangement according to FIG. 1G after the semiconductor module is positioned on a heat sink by adjustment pins engaging into positioning openings in the heat sink.
Figure 2:
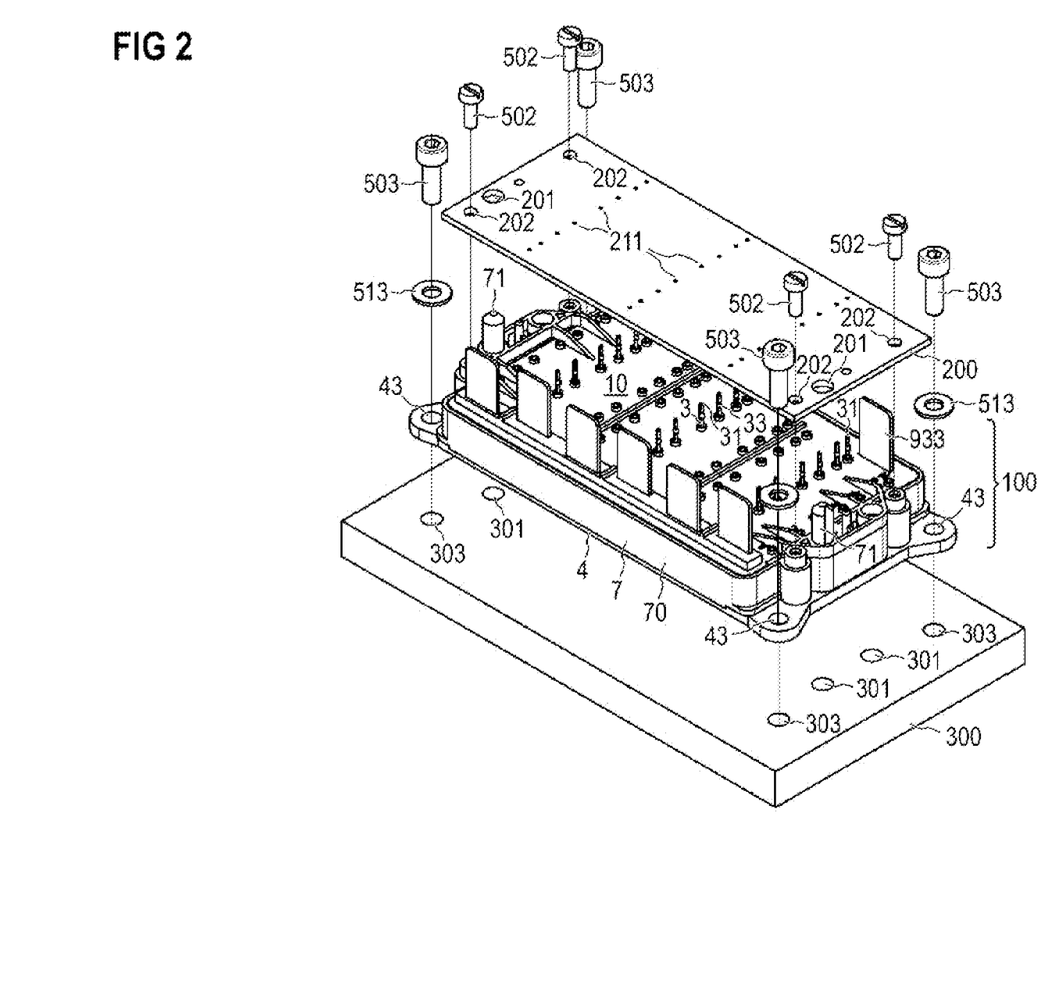
FIG. 2 shows a perspective exploded illustration of the semiconductor module arrangement according to FIG. 1G with the additional illustration of connecting screws.

FIG. 2 further shows an exploded illustration of the arrangement according to FIG. 1H, wherein different screws for fastening the elements to one another are additionally illustrated. Therefore, screws 502 which engage into passage openings 202 in the printed circuit board 200 serve to secure the printed circuit board 200 to the semiconductor module 100. Further screws 503 serve, in connection with optional washers 513, to screw the power semiconductor module 100 to the base plate 4 using threaded holes 303 in a heat sink 300 by the screws 503 being passed through fitting openings 43 in the base plate 4 and being screwed into the threaded holes 303.

Figure 3:
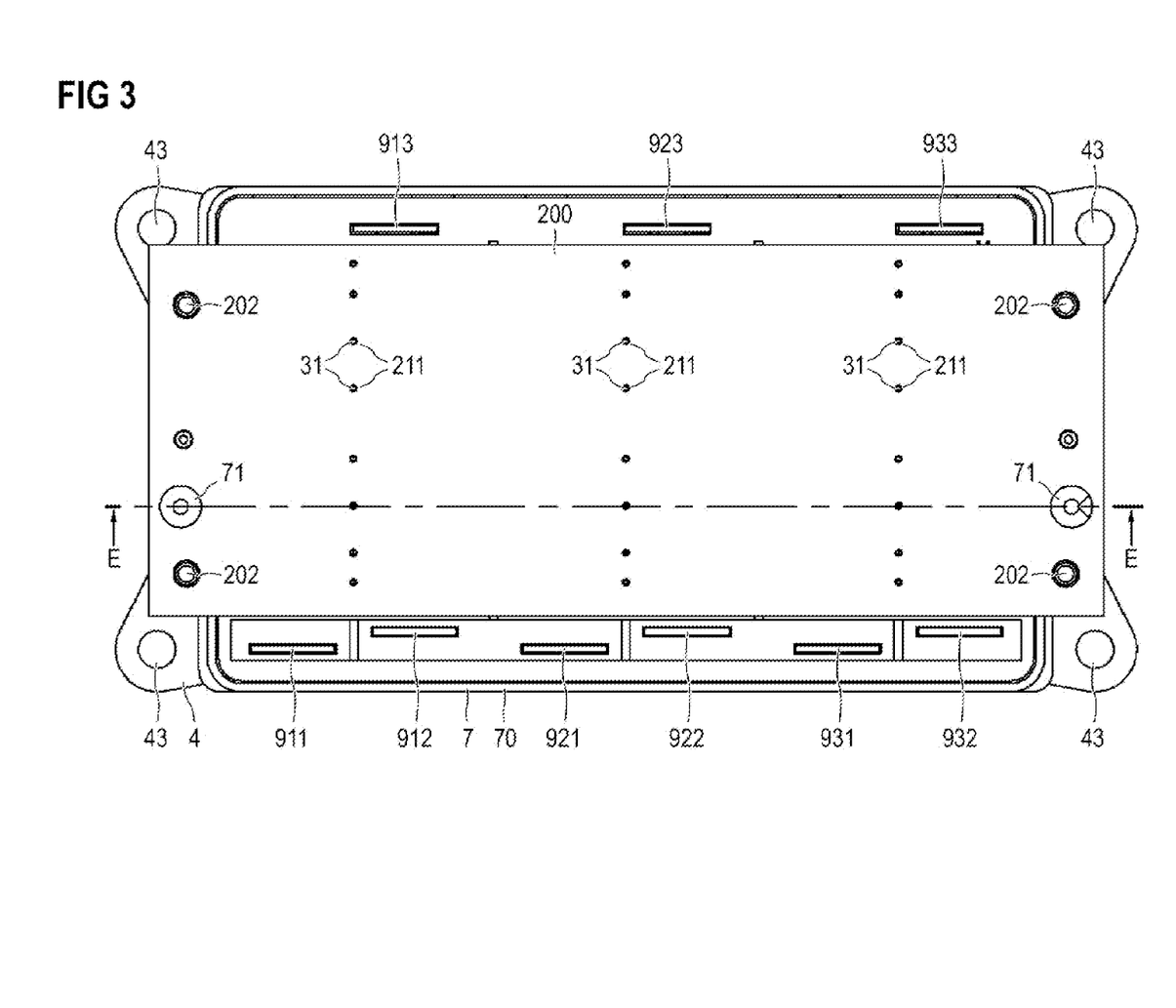
FIG. 3 shows a plan view of the semiconductor module arrangement according to FIG. 1G.

FIG. 3 further shows the plan view of the semiconductor module arrangement which is shown in FIG. 1H, but without the screws 502, 503 which are shown in FIG. 2 and also without the heat sink 300. The sectional plane E-E' which is associated with FIGS. 1A to 1H is likewise illustrated.

As can be gathered from the view according to FIG. 3, the semiconductor module 100 can have further load connection contacts 911, 921, 931, for example for connecting a positive supply voltage, and also further load connection contacts 912, 922, 932, for example for connecting a negative supply voltage. These connection contacts 911, 912, 921, 922, 931, 932, like the connection contacts 913, 923, 933, can be in the form of stamped and bent metal sheets and be connected to one or more of the circuit mounts 2.

Figure 4:
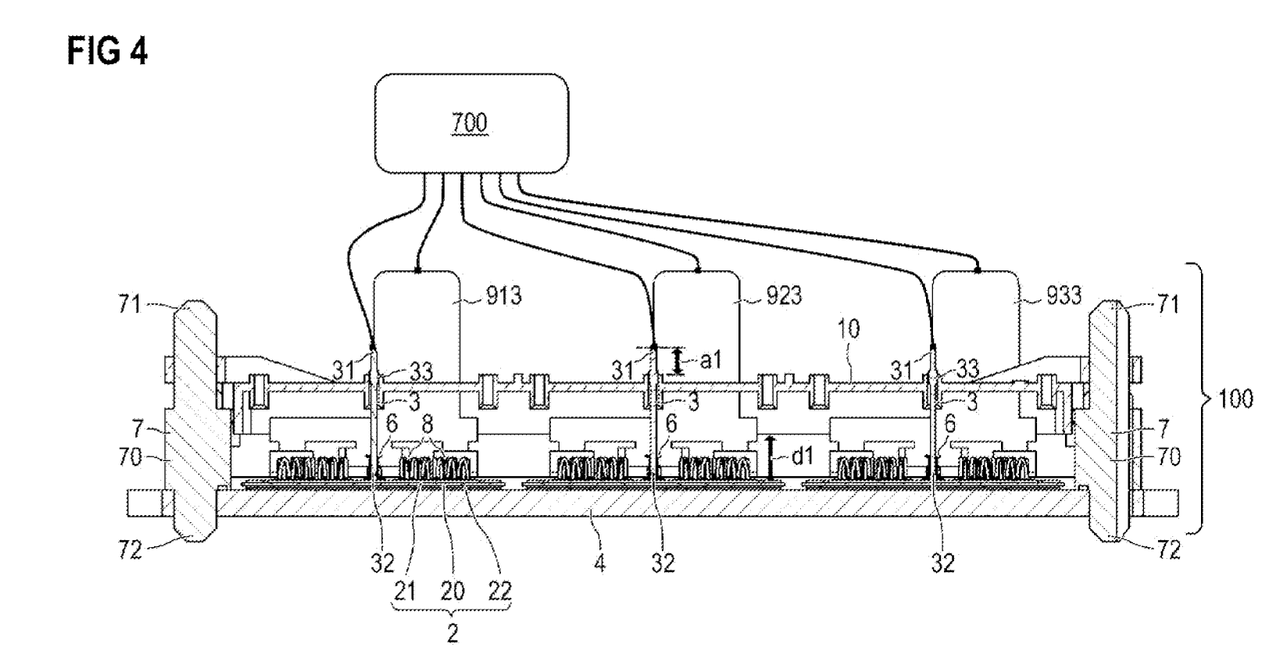
FIG. 4 shows the implementation of a function test of the semiconductor module after the adjustment device is mounted and before the printed circuit board is fitted.

As further illustrated with reference to FIG. 4, the semiconductor module 100 can be subjected to a function test before the printed circuit board 200 is fitted but after the adjustment device is mounted and therefore also after the circuit mount 2 or the circuit mounts 2 is/are fitted to the housing 7. To this end, a test device 700 makes electrical contact with the first end 31 of each of the electrical connections 3, amongst others, it likewise being possible for this to be performed in an automated manner. The test device 700 can optionally also make electrical contact with one, several or all of the load connection contacts 911, 912, 921, 922, 931, 932 during the function test. If the semiconductor module 100 is found to be faulty in the function test, it can be repaired or removed, specifically before a printed circuit board 200 is fitted to it. The structure of the semiconductor module 100 according to FIG. 4 corresponds to the state of the semiconductor module 100, as shown in FIG. 1E, after the pick-and-place device 600 is removed when the adjustment device 10 is in the first relative position.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor module arrangement, the method comprising:
    providing a semiconductor module comprising a circuit mount populated with a semiconductor chip, an adjustment device in a first relative position with respect to the circuit mount and fitted to the circuit mount, a plurality of electrical connections each having a free first end and a second end electrically conductively connected to the circuit mount, wherein each of the electrical connections is routed through a different passage opening in the adjustment device;
    pushing a printed circuit board onto the electrical connections by each of the free first ends being inserted into a different contact opening in the printed circuit board; and
    moving the adjustment device to a second relative position, which is different from the first relative position, with respect to the circuit mount.

2. The method of claim 1, wherein a distance between the circuit mount and the adjustment device in the second relative position is smaller than in the first relative position.

3. The method of claim 1, wherein a distance between the circuit mount and the adjustment device in the second relative position is least 1.5 mm smaller than a distance between the circuit mount and the adjustment device in the first relative position.

4. The method of claim 1, wherein the adjustment device is pushed out of the first relative position by the printed circuit board being pushed onto the electrical connections.

5. The method of claim 1, wherein each of the electrical connections is pressed into the associated contact opening when the printed circuit board is pushed onto the electrical connections.

6. The method of claim 1, wherein the adjustment device is held in the first relative position by a latching connection to a housing of the semiconductor module and/or by a frictional connection in relation to a housing of the semiconductor module.

7. The method of claim 1, wherein the free first end of each of the electrical connections projects out of the adjustment device by at most 3 mm when the adjustment device is in the first relative position.

8. The method of claim 1, wherein the free first end of each of the electrical connections projects out of the adjustment device by at least 4 mm when the adjustment device is in the second relative position.

9. The method of claim 1, wherein the semiconductor module is configured for functional testing, by a test device making electrical contact with the free first end of each of the electrical connections, when the adjustment device is in the first relative position and when the printed circuit board is not yet pushed onto the electrical connections.

10. The method of claim 1, wherein the adjustment device is mounted by a first pick-and-place apparatus after the circuit mount is fitted to a housing of the semiconductor module and before the printed circuit board is pushed onto the electrical connections.

11. The method of claim 10, wherein the printed circuit board is pushed onto the electrical connections by a second pick-and-place apparatus.

12. The method of claim 1, wherein the semiconductor module further comprises a plurality of electrically conductive sleeves, each of which is electrically conductively connected to a metallization of the circuit mount, and wherein the electrical connections comprise pins, each of which is inserted into a different one of the sleeves and makes electrically conductive contact with the sleeves.

\* \* \* \* \*